United States Patent [19]

Rubin

[11] Patent Number: 5,610,556
[45] Date of Patent: Mar. 11, 1997

[54] MULTI-PORT AMPLIFIERS WITH SWITCHLESS REDUNDANCY

[75] Inventor: Michael D. Rubin, Saratoga, Calif.

[73] Assignee: Space Systems/Loral, Inc., Palo Alto, Calif.

[21] Appl. No.: 550,575

[22] Filed: Oct. 31, 1995

[51] Int. Cl.[6] ........................................... H03F 3/68
[52] U.S. Cl. ........................ 330/124 D; 330/124 R; 330/295
[58] Field of Search ................... 330/124 R, 124 D, 330/295; 333/109, 116, 117

[56] References Cited

U.S. PATENT DOCUMENTS

| | | | |
|---|---|---|---|
| 3,571,739 | 3/1971 | Seidel | 330/124 R |
| 3,740,756 | 6/1973 | Sosin | 33/117 X |
| 3,928,806 | 12/1975 | Carter et al. | 325/128 |
| 4,010,426 | 3/1977 | Rambo | 330/53 |
| 4,198,611 | 4/1980 | Eng | 333/105 |
| 4,477,781 | 10/1984 | Reuss, Jr. | 330/286 |
| 4,618,831 | 10/1986 | Egami et al. | 330/124 |
| 4,644,301 | 2/1987 | Hecht | 333/101 |
| 4,780,685 | 10/1988 | Ferguson | 330/124 D |
| 4,825,172 | 4/1989 | Thompson | 330/124 R |
| 4,831,619 | 5/1989 | Rosen | 370/75 |
| 4,868,520 | 9/1989 | Terakawa et al. | 330/295 |
| 5,033,108 | 7/1991 | Lockwood | 455/12 |
| 5,055,798 | 10/1991 | Heinzelmann | 330/295 |

FOREIGN PATENT DOCUMENTS 0355979  2/1990  European Pat. Off. ............... 330/295

OTHER PUBLICATIONS

"An Adaptive Multiple Beam System Concept", S. Egami et al. IEEE Journal on Selected Areas in Communications, vol. SAC-5, No. 4, May 1987.

Primary Examiner—James B. Mullins
Attorney, Agent, or Firm—Perman & Green

[57] ABSTRACT

A multi-port amplifier system for multi-beam communication antennas in which redundancy is achieved without using RF switches. The multi-port amplifiers are divided into sets of stages arranged in tree fashion and the amplifier stages can be turned off without degrading port-to-port isolation. In one embodiment there are thirty-two input ports 1 through 32 and thirty-two corresponding output ports 1 through 32 wherein input port 1 is functionally connected to output port 1 and so on. An input signal to each of the input ports 1 through 32 is connected to a separate one of a first group of sixteen, four stage multi-port hybrid circuits. The outputs of the first group of multi-port hybrid circuits are connected through solid-state power amplifiers to a second group of sixteen, four stage multi-port hybrid circuits which are also labeled according to the input port numbers to which they are functionally connected.

4 Claims, 10 Drawing Sheets

MULTI-PORT AMPLIFIERS WITH SWITCHLESS REDUNDANCY

BACKGROUND OF THE INVENTION

1. Field of the Invention

The present invention relates to multi-beam communication systems using a plurality of electromagnetic wave beams, and more particularly, to a communication transmitter including multi-port redundant amplifier configurations for amplifying a plurality of signals for transmission by multi-beam antennas.

2. Background Art

Modern communication satellite systems employ multi-beam antenna technology. One common method as shown in FIG. 1 for implementing a multi-beam antenna for a satellite 100 is to provide multiple primary input terminal feeds 1—1 through 1-N that illuminate a common reflector 9 so that each feed forms a beam spatially distinct from that of every other feed. The other feeds are arranged so that the other spatially distinct beams 6-1 through 6-N will cover the desired area 5-1 through 5-N on the Earth's surface. Once the antenna design is determined the next step is to design the transmitter or power amplifier suite to drive it.

The usual configuration for driving multiple feeds is to dedicate a power amplifier such as amplifiers 2-1 through 2-N respectively connected to input feeds 1—1 through 1-N and having output terminals 3-1 through 3-N connected to antenna 4. While this straight forward approach works it has drawbacks. In FIG. 1, the transmission output at each output terminal is limited by the output P of each of the amplifiers 2-1 to 2-N. That is to say, the path between each input terminal and the corresponding output terminal is constructed completely independently of the other paths. On account of this, for instance, even if the amplifiers 2-1 has a margin in its power thereto from the input terminal 1—1 and amplified thereby for output to the output terminal 3-1, the margin cannot be used for signals which are provided to the other output terminals.

In multi-beam satellite communication, the number of carriers which each beam transmits varies with the amount of communication traffic in each of the service areas 5-1 through 5-N, therefore, it is necessary that each of the amplifiers $2_1$, $2_2$ . . . for the beams have a power amplification capacity large enough to sufficiently amplify the input signal when it is assigned the largest number of carriers. To meet this requirement, an expensive amplifier of a large power capacity must be prepared for each beam, but when the number of carriers assigned to the input signal is small, such capacity of the amplifier is not effectively utilized. Furthermore, even in the case where the amplifier has a margin in its output but another amplifier wants more output, the surplus power cannot be assigned to the beam of insufficient power. Since space borne equipment must be redundant, usually two amplifiers are provided for each feed, one active, one standby redundant. This essentially doubles the cost of the amplifiers. Also, each amplifier is totally independent, providing no means of power sharing or combining. The advantage of this approach is that since the power amplifiers are totally independent, they do not have to be matched for gain, phase or power output, nor must they track each other over time or temperature. This is most advantageous if the output stage consists of a single device.

To maximize reliability, it is desirable to implement microwave power amplifiers with solid state devices. Solid state device characteristics generally require that multiple devices be used in the output stage, and sometimes in the driver stage of a solid state microwave power amplifier. The common method for implementing this approach is to use a hybrid tree to split the input into multiple paths to feed multiple solid state amplifiers and use a reciprocal hybrid tree to combine the outputs of the multiple stages into a single output. A typical example of this type of amplifier, referred to as a combined amplifier, is shown in FIG. 2. The implementation shown in FIG. 2 combines the capability of eight amplifier stages. Elements 110 are amplifier modules and elements 112 are ninety degree hybrids. One port of each of the hybrids 112 is terminated by a load resistor. If the amplifiers are well matched for gain and phase, and the hybrids are properly designed and implemented, then if Po is the power output capability of a single stage, the combined amplifier has a power output capability of eight Po less some small combining loss.

A more general and flexible solution is to use a "Hybrid Transponder" or "Multi-port Amplifier" which is analyzed in the publication entitled "An Adaptive Multiple Beam System Concept" by Shunichiro Egami and Makoto Kawai, IEEE Journal on Selected Areas in Communications Vol SAC-5, No. 4, May 1987.

The multi-port amplifier uses multiple amplifier modules as does the combined amplifier discussed previously. In the multi-port amplifier, the input and output hybrid trees are replaced by suitable multi-port hybrids. An embodiment of an eight port multi-port amplifier is shown in FIG. 3 and includes amplifier modules 114 and multi-port ninety degree hybrids 116. It can be shown that there is a one to one correlation between each input and its corresponding output for the multi-port amplifier. Specifically, if the amplifier stages in the multi-port amplifier are matched for gain and phase, exciting one input port of a multi-port amplifier will produce an output at only one unique corresponding output port, and insignificant output signal levels at the other output ports. Therefore, if different multiple beam antenna feeds are attached to different output ports, the beam can be switched simply by exciting the proper input port. This allows a single amplifier to be used for all feeds, providing maximum flexibility in the allocation of power output to each beam. Isolation between beams depends upon the gain and phase matching of the amplifier stages. Increasing the number of stages increases the output signal isolation in the presence of amplifier stage mismatch. Therefore, it is desirable to use many more ports than the required number of beams to gain tolerance for amplifier stage mismatch.

Given the desirability of the multi-port amplifier, the implementation of redundancy becomes an important consideration. Given the large number of amplifier modules it does not appear efficient to simply switch in a new multi-port amplifier if a single module fails. This not only requires a large number of redundancy switches, but also fails to take advantage of the flexibility and graceful degradation characteristics of the Multi-Port Amplifier.

FIG. 4 shows still another implementation of a multi-port amplifier circuit. In FIG. 4, T switches are used to switch in a standby redundant amplifier stage for either of two adjacent amplifier stages. This implementation requires four extra stages and twenty-four "T" switches. It is also complicated by the fact that all path lengths must not change when switching between an active and redundant stage. This solution has both high weight and high recurring touch labor costs and is undesirable.

Background references that illustrate the state of the art include the following.

U.S. Pat. No. 5,055,798 issued Oct. 8, 1991 to Heinzelmann entitled "Hybrid Matrix Amplifier Systems And Methods For Making Thermally-Balanced Hybrid Matrix Amplifier Systems" discloses a hybrid matrix amplifier system that yields balanced thermal loads with minimal input signal constraints and includes an input multi-port hybrid coupler system having outputs joined to a plurality of amplifiers, and an output multi-port hybrid coupler system joined to outputs of the amplifiers. The input multi-port hybrid coupler system, and the output multi-port hybrid coupler system, each include n stages where n is an integer equal to or greater than 1, with each stage including $2^{n-1}$ couplers. These coupler systems may also include strategically-placed phase shifters. Such systems also include N amplifiers where N is equal to $2^n$, with N inputs from the outputs of the input multi-port hybrid coupler system, and with the outputs of he amplifiers connected as inputs to the output multi-port hybrid coupler system. This configuration permits a division of the N amplifiers into two groups that each dissipates substantially the same quantity of heat energy.

U.S. Pat. No. 5,033,108 issued Jul. 16, 1991 to Lockwood entitled "Signal Repeater Using Shared Amplification With Selectable Input/Output Connections" discloses a signal repeater assembly for a spacecraft that includes a channel selectively network (CSN) having a plurality of first input ports connected by selectively operable filter circuits to a plurality of first output ports to enable a signal at any selected first input port to be passed to any selected first output port. The CSN is connected to a shared power amplification module (SPAM) having a plurality of second input ports for receiving signals from the first output ports, a plurality of second output ports and a network of balanced amplifier devices operable to couple the second input ports to the second output ports so that any amplification of a signal received at any one of the second input ports is shared by all the amplifier devices to allow the total available amplification power to be used by any one or a combination of second output ports.

U.S. Pat. No. 4,868,520 issued Sep. 19, 1989 to Terakawa et al. entitled "High-Frequency Synthesizing Apparatus" discloses a high-frequency power synthesizing apparatus having a plurality of distributors arranged in a plurality of stages, a plurality of amplifiers which are supplied with outputs from a final stage of said power distributors and which amplify these outputs to a predetermined level, and a power synthesizing unit including initial-stage power synthesizers supplied with outputs from said amplifiers and a final-stage synthesizer which outputs power to an external load. The final-stage power distributors and the initial stage synthesizers are constituted by $0°$-hybrid modules. The output levels of the amplifiers can be displayed on an external display.

U.S. Pat. No. 4,831,619 issued May 16, 1989 to Rosen entitled "Satellite Communications System Having Multiple Downlink Beams Powered By Pooled Transmitters" describes a satellite communications system that employs separate subsystems for providing broadcast and point-to-point two-way communications using the same assigned frequency band. The broadcast and point-to-point subsystems employ an integrated satellite antenna system which uses a common reflector. The point-to-point subsystem achieves increased communication capacity through the reuse of the assigned frequency band over multiple, contiguous zones covering the area of the earth to be serviced. Small aperture terminals in the zones are serviced by a plurality of high gain downlink fan beams steered in the east-west direction by frequency address. A special beam-forming network provides in conjunction with an array antenna the multiple zone frequency address function. The satellite employs a filter interconnection matrix for connecting earth terminals in different zones in a manner which permits multiple reuse of the entire band of assigned frequencies. A single pool of solid state transmitters allows rain disadvantaged users to be assigned higher than normal power at minimum cost. The intermodulation products of the transmitters are geographically dispersed.

U.S. Pat. No. 4,825,172 issued Apr. 25, 1989 to Thompson entitled "Equal Power Amplifier System For Active Phase Array Antenna And Method Of Arranging Same" discloses an equal power amplifier system for amplifying a plurality of signals for transmission by an active phase array antenna, and a compact plural level beam-forming network for forming a plurality of such signals, for example on excitation patterns for frequency scanned virtual beams, are disclosed. The amplifier system uses at most only a few sizes of power amplifiers to amplify efficiently numerous signals having significantly different amplitudes. This is accomplished by distributing the task of amplifying signal pairs composed of one large amplitude signal and one small amplitude signal to equally sized power amplifiers. The first hybrid coupler divides the two signals for input into the two power amplifiers. The second hybrid coupler receives the intermediate amplified signals from the power amplifiers and through constructive and destructive interference produces amplified output signals corresponding to the input signals.

U.S. Pat. No. 4,780,685 issued Oct. 25, 1988 to Ferguson entitled "Composite Power Amplifier With Redundancy" describes a power combiner that includes an input power splitter driving a plurality of amplifiers. The amplifier outputs have $Z_0$ output impedance and are coupled by transmission lines of $Z_0$ characteristic impedance to the junction point of a loss less power combiner. Short-circuiting switches disconnect failed amplifiers from the combiner.

U.S. Pat. No. 4,644,301 issued Feb. 17, 1987 to Hecht entitled "Redundancy System and Switching Network" discloses a redundancy switching system which provides four reserve devices is disclosed which is suitable for use with from eight to twelve channels. The switches in the input switching network of this redundancy system are connected in first and second sections. Each section includes a ring of switches and two switches connected as appendages to the ring. Only as many switches are needed to control the input connection to the redundant devices as there are redundant devices. A similar number of switches are needed to control the output connection of the active devices.

U.S. Pat. No. 4,618,831 issued Oct. 21, 1986 to Egami it el. entitled "Power Amplifying Apparatus" relates to a system wherein a first multi-port hybrid coupler is formed by hybrid couplers alone, which are divided into n stages, each including $2^{n-1}$ hybrid couplers. A signal input to any one of N (=$2^n$) input terminals of the first stage is distributed equally to N output terminals of the nth stage. The N output terminals of the nth stage of the first multi-port hybrid coupler are connected to N amplifiers at the input side thereof, respectively, and the N amplifiers are connected at the output side to a second multi-port hybrid coupler. The second multi-port hybrid coupler is identical in construction with the first multi-port hybrid coupler, but its input terminals and output terminals are reverse from those of the latter and the input terminals of the second multi-port hybrid coupler are connected to the N amplifiers in an order reverse from the order of arrangement of the output terminals of the first multi-port hybrid coupler.

U.S. Pat. No. 4,477,781 issued Oct. 16, 1984 to Reuss, Jr. entitled "Combined Microwave Parallel Amplifier-RF Attenuator/Modulator" discloses a parallel channel microwave amplifier comprising a plurality of amplification channels interconnecting a power-dividing matrix and a power-combining matrix. Each amplification channel includes a phase shifter, an attenuator and a power amplifier connected in series. The device functions as a combination of amplifier and an r.f. attenuator/modulator.

U.S. Pat. No. 4,198,611 issued Apr. 15, 1980 to Eng entitled "Redundancy System With Eight Devices For Five Channels" describes a redundancy system for use in a communications satellite. Eight traveling wave tube amplifiers are provided for five communications channels in a manner such that full service is maintained even though any three of the amplifiers have failed. A ten-switch network connects the five channels to the inputs of the eight TWT amplifiers, and a mirror-image ten-switch network connects the outputs of the eight TWT amplifiers to the five channels.

U.S. Pat. No. 4,010,426 issued Mar. 1, 1977 to Rambo entitled "Re-Power Amplifier Parallel Redundant System" teaches an RF power amplifier parallel redundant circuit that employs three amplifiers. Under normal operation when all three amplifiers are functioning, the output from a comparator holds a 0°, 60° two-bit phase shifter in the 60° position. When anyone of the amplifiers or any pair of amplifiers fail, the comparator output causes the two-bit phase shifter to switch to the 0° position. The system holds the power output constant at one-fourth the value of each individual amplifier for single or double failures. Only one simple switching position operation is required.

U.S. Pat. No. 3,928,806 issued Dec. 23, 1975 to Canter et al. entitled "Power Dividing And Combining Techniques For Microwave Amplifiers" discloses a novel microwave power divider that is a combination of an N port junction circulator and a novel isolator-mismatch device for each circulator port other than one input port and divides microwave signal power incident to the input port into any desired ratio among the output ports and isolates all the ports from microwave power reflected back toward the divider after being propagated through the divider and thus prevents interaction among line devices, e.g., amplifier units, that are fed by the output ports. Also a novel microwave power combiner is disclosed that is a combination of an N-port junction circulator and a novel isolator-reflector device for each port other than one output port to combine at the one output port identical microwave signals or microwave signals that differ in frequency of phase incident to the isolator-reflector devices. The microwave power combiner, like the micro wave power divider, provides isolation among the signal transmission lines. Also, a novel solid-state microwave power amplifier is disclosed that includes the novel power divider, a solid-state power amplifier unit for each power fraction from the outputs of the divider and the novel power combiner for the amplified outputs of the power divider.

SUMMARY OF THE INVENTION

The present invention provides a multi-port amplifier system for multi-beam communication antennas in which redundancy is achieved without using RF switches. The multi-port amplifiers are divided into sets of stages arranged in tree fashion. The amplifier stages can be turned off without degrading port-to-port isolation.

BRIEF DESCRIPTION OF THE DRAWINGS

The above set forth and other features of the invention are made more apparent in the ensuing Detailed Description of the Invention when read in conjunction with the attached drawings, wherein:

FIG. 6 shows how FIGS. 6A and 6B are combined to provide a schematic illustration of a multi-port amplifier system with embedded hybrid trees according to the principles of the present invention.

FIG. 7 shows how

DESCRIPTION OF A PREFERRED EMBODIMENT

Figure 1:
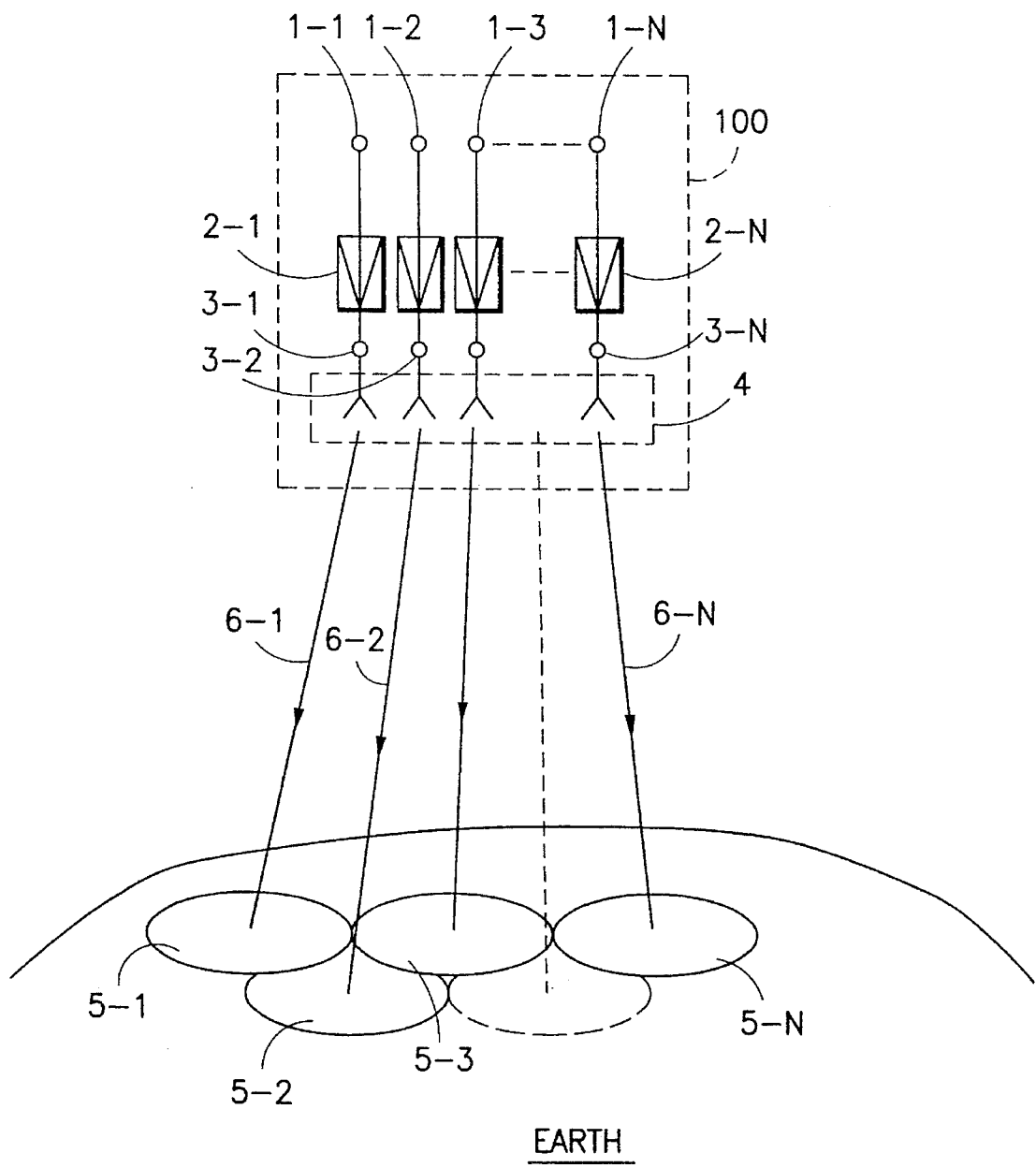
FIG. 1 is a schematic block diagram illustrating a prior art multi-beam satellite communication system.
Figure 2:
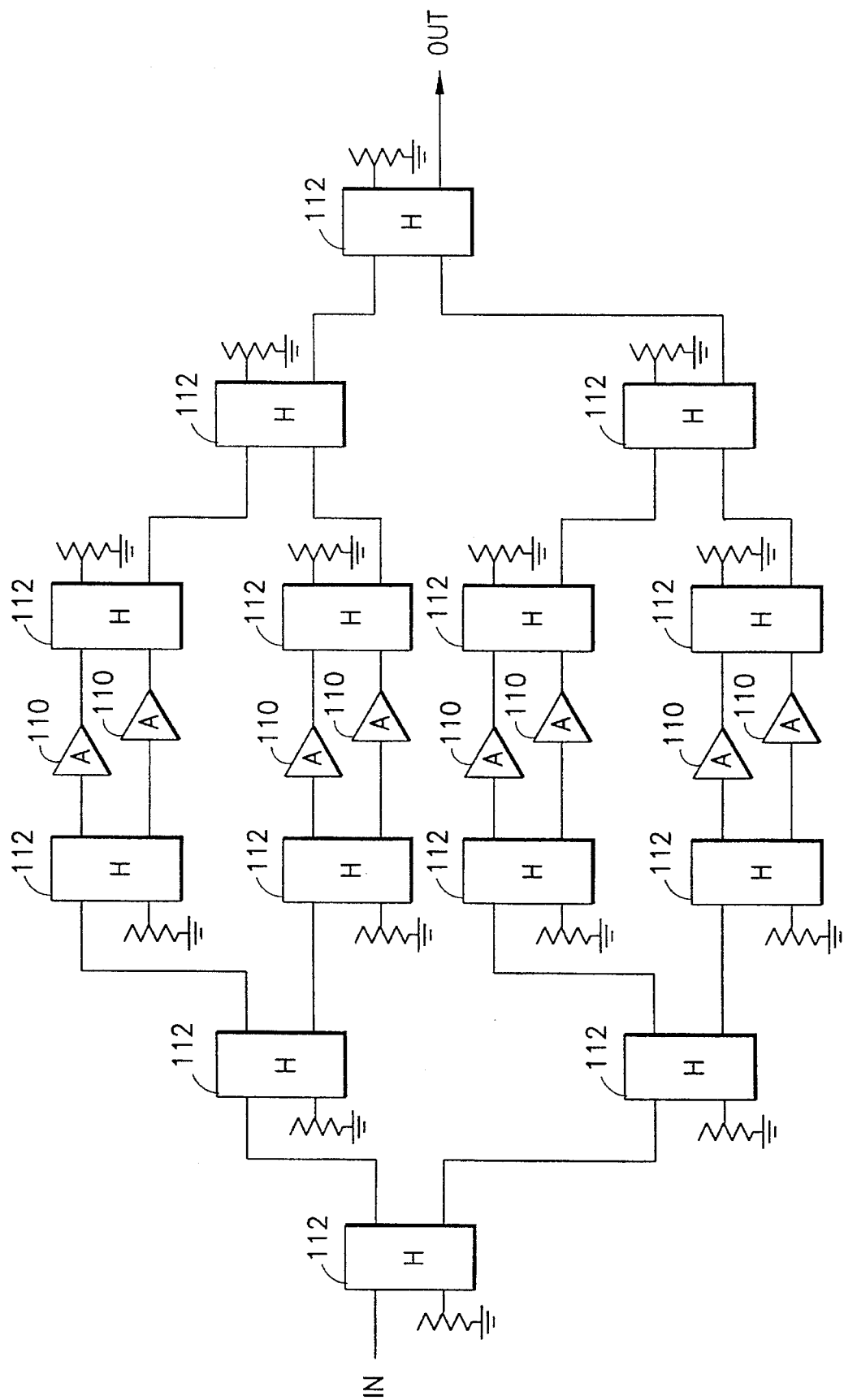
FIG. 2 is a schematic illustration of a multi-stage combined amplifier circuit employing hybrid tree techniques according to the prior art.
Figure 3:
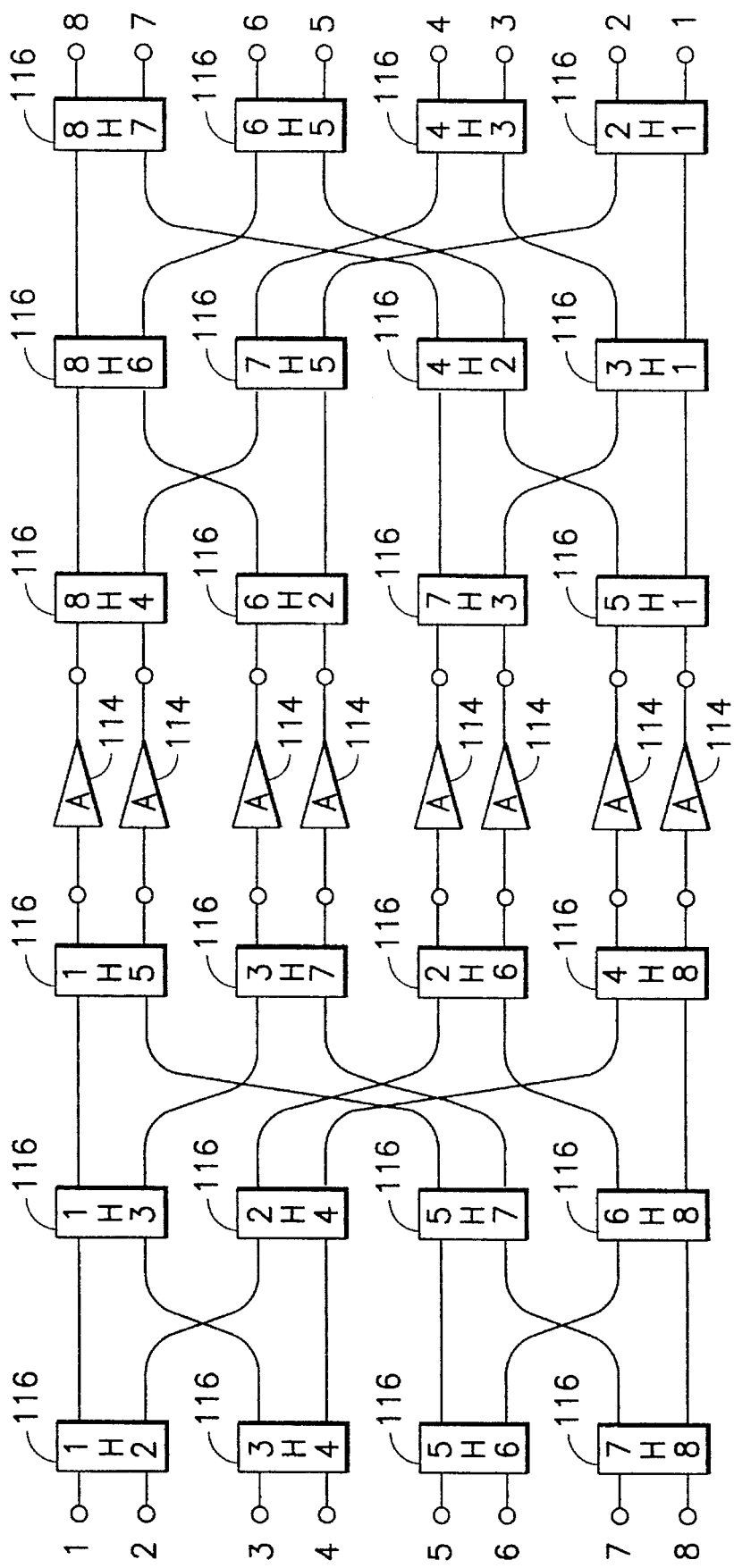
FIG. 3 is a schematic illustration of a multi-stage amplifier circuit including multi-port amplifiers according to the prior art.
Figure 4:
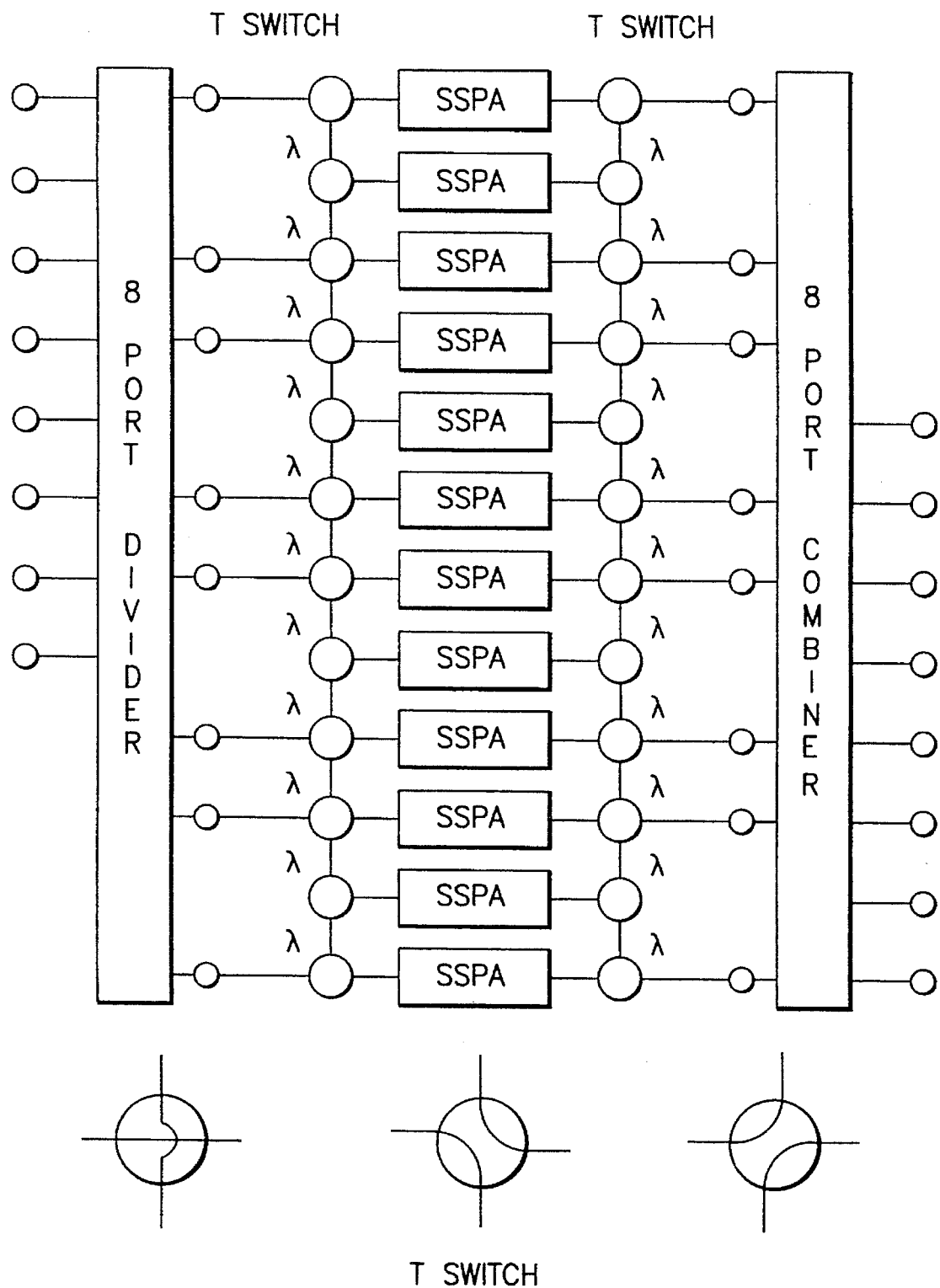
FIG. 4 is a schematic illustration of a multi-port amplifier circuit including T switches and providing three-for-two redundancy according to the prior art.

The present invention provides a multi-port amplifier system wherein it is possible to trade the high weight and high recurring touch labor cost of prior art systems as described and shown in FIGS. 2, 3 and 4 for a redundancy scheme that uses somewhat higher power. The exact loss of efficiency and loss of isolation versus the reliability of the multi-port amplifier is complex so that the exact configuration choices must be made in the context of an actual application. For purposes of explanation of the present invention, it is assumed that there are four separate antenna beams. To help insure good isolation and graceful degradation, it is assumed that the basic multi-port amplifier has thirty-two amplifier device stages. An embodiment of a thirty-two stage multi-port amplifier with thirty-two ports according to the present invention is shown in FIGS. 5A and 5B.

Figures 5, 5A, 5B:
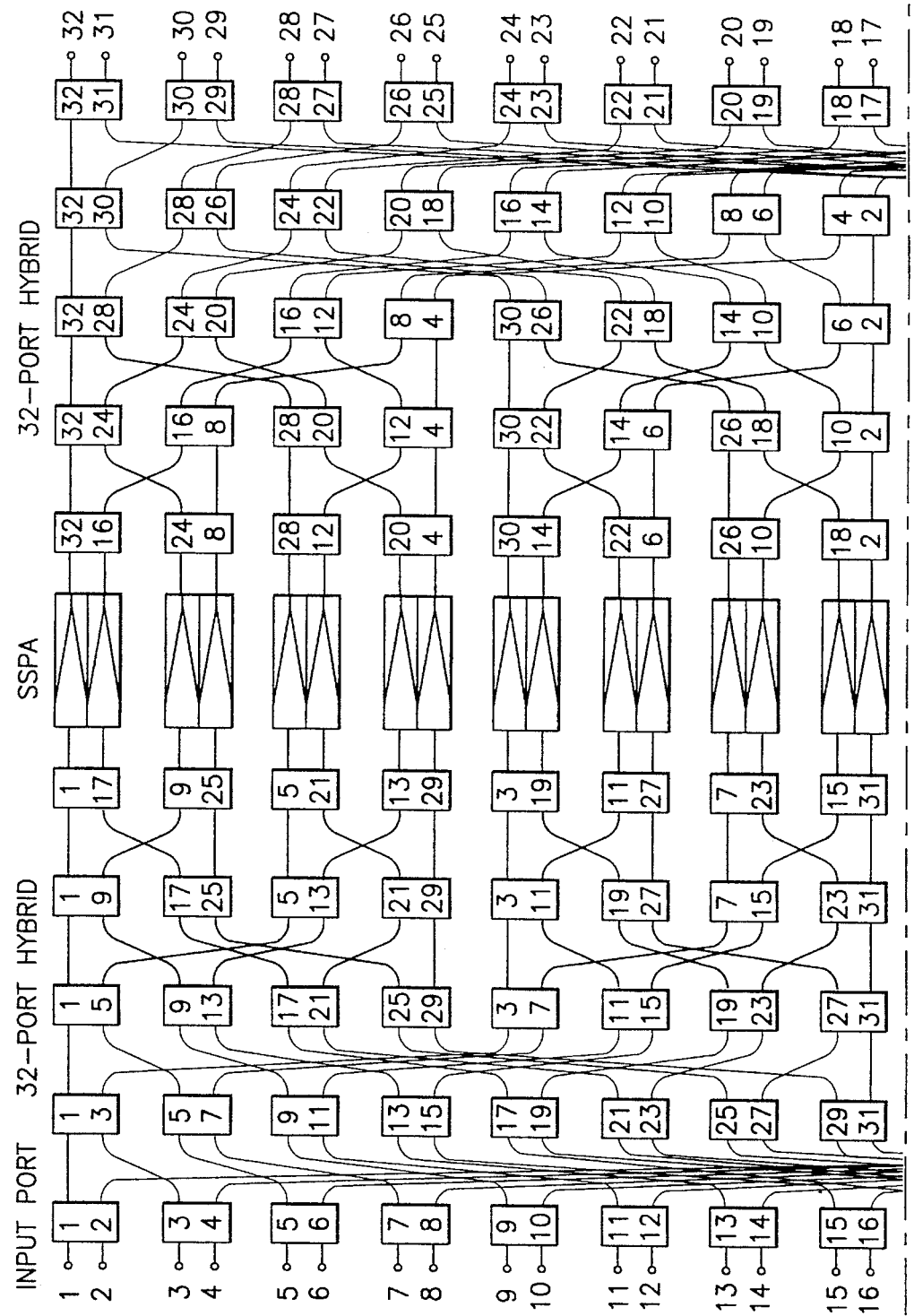
FIG. 5 shows how
FIGS. 5A and 5B are combined to provide a schematic illustration of a multi-port amplifier system according to the principles of the present invention.
Figure 5B:
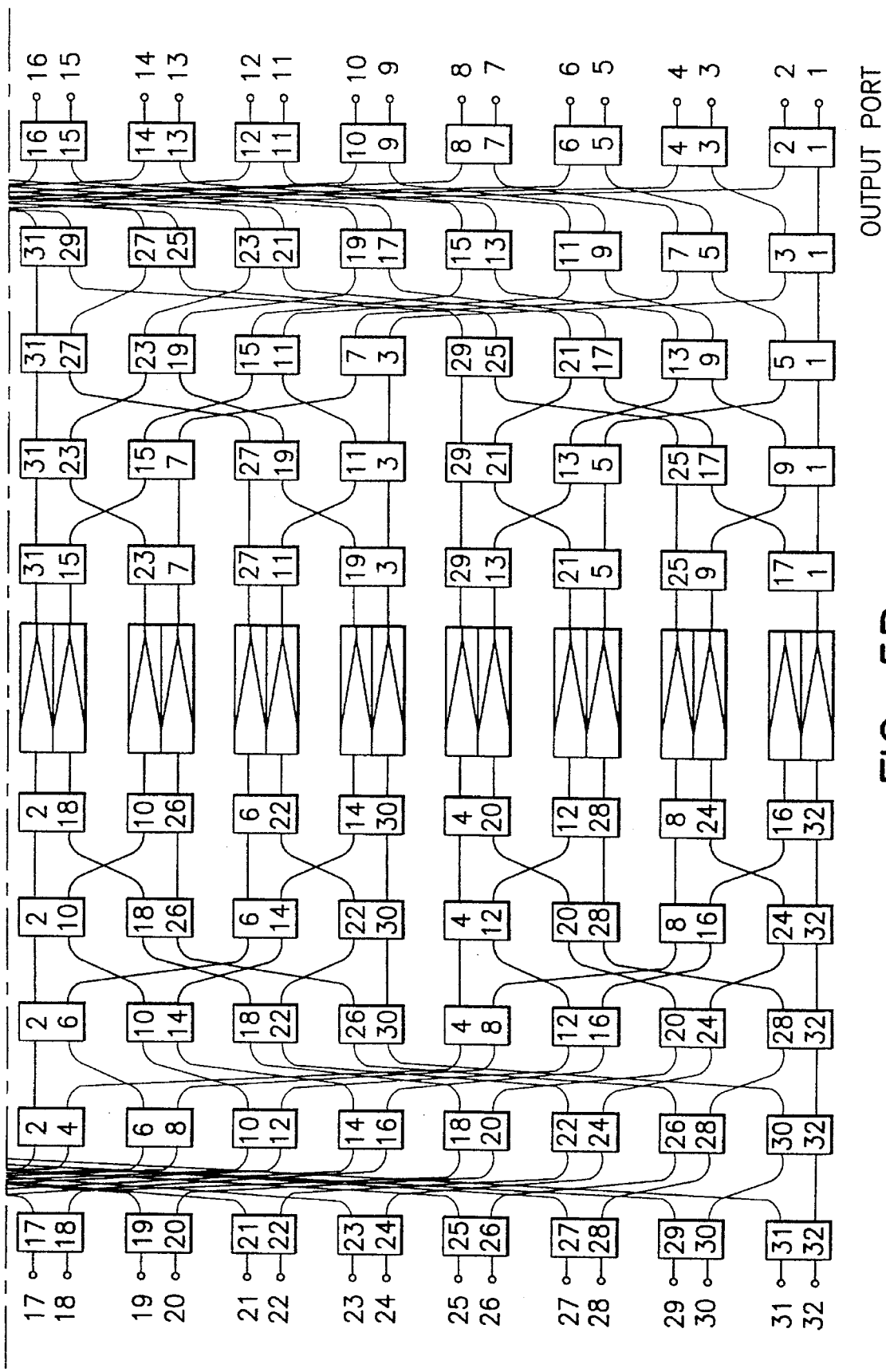

In FIGS. 5A and 5B, there are thirty-two input ports labeled 1 through 32 and thirty-two corresponding output ports similarly labeled 1 through 32 indicating that input port 1 is functionally connected to output port 1 and so on. An input signal to each of the input ports 1 through 32 is connected to a separate one of a first group of sixteen, four stage multi-port hybrid circuits. The connective paths are designated by the input port numbers shown on each of the hybrid circuit in FIGS. 5A and 5B. The outputs of the first group of multi-port hybrid circuits are connected through solid-state power amplifiers to a second group of sixteen, four stage multi-port hybrid circuits which are also labeled according to the input port numbers to which they are functionally connected.

Figure 6B:
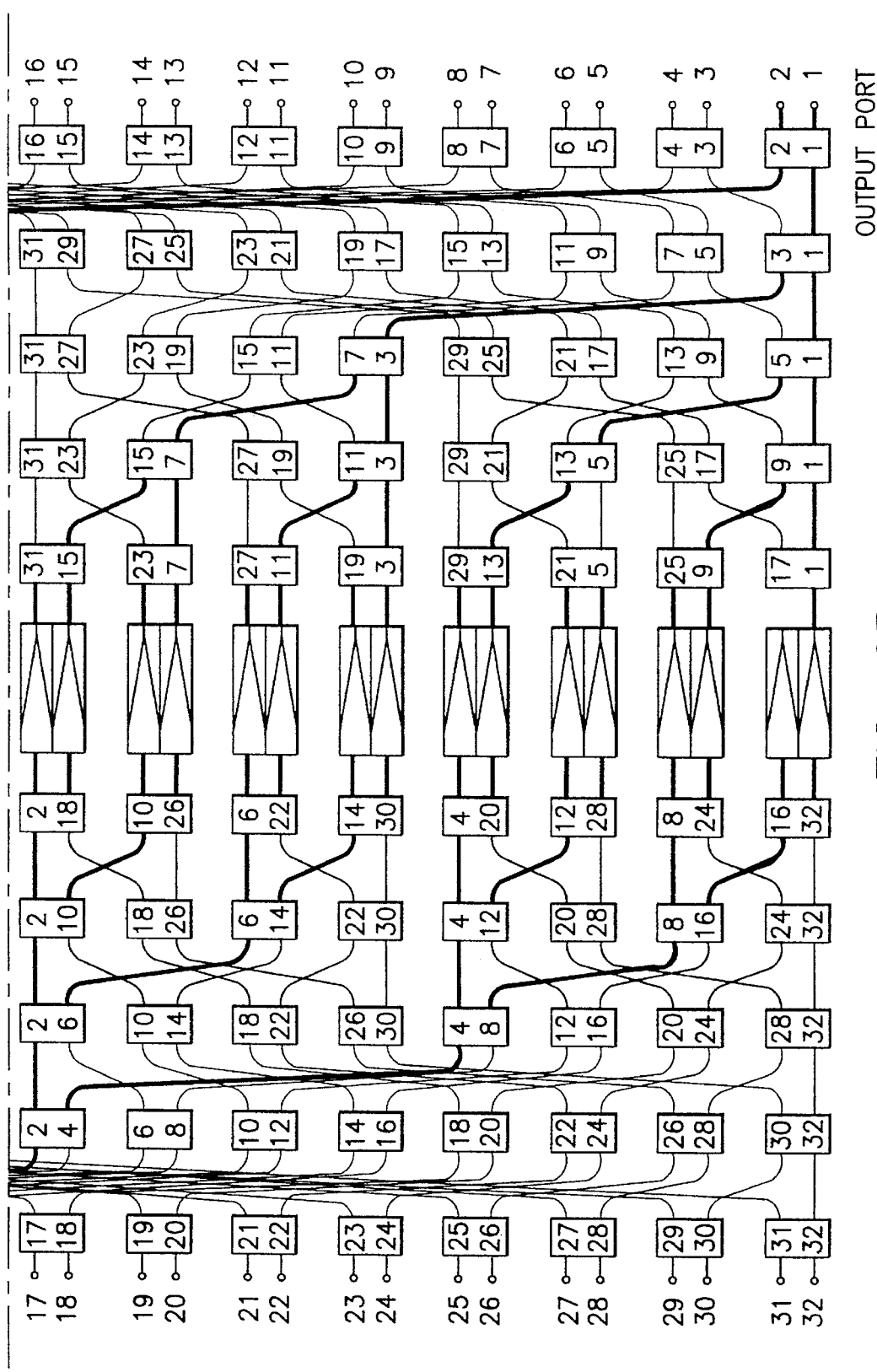
Figure 7A:
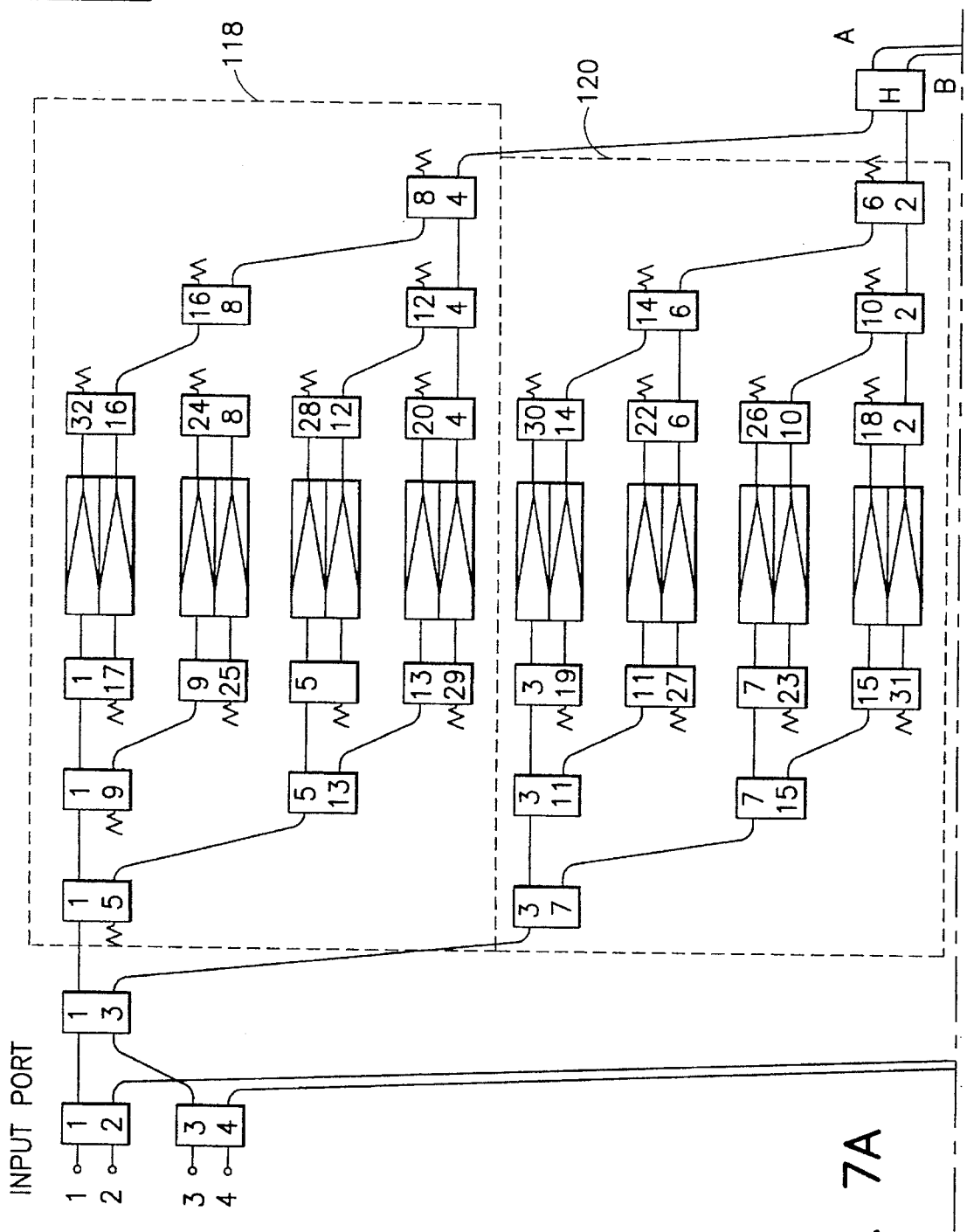
FIGS. 7A and 7B are combined to provide a schematic illustration of a multi-port amplifier system with excess hybrid trees removed according to the principles of the present invention.
Figure 7B:
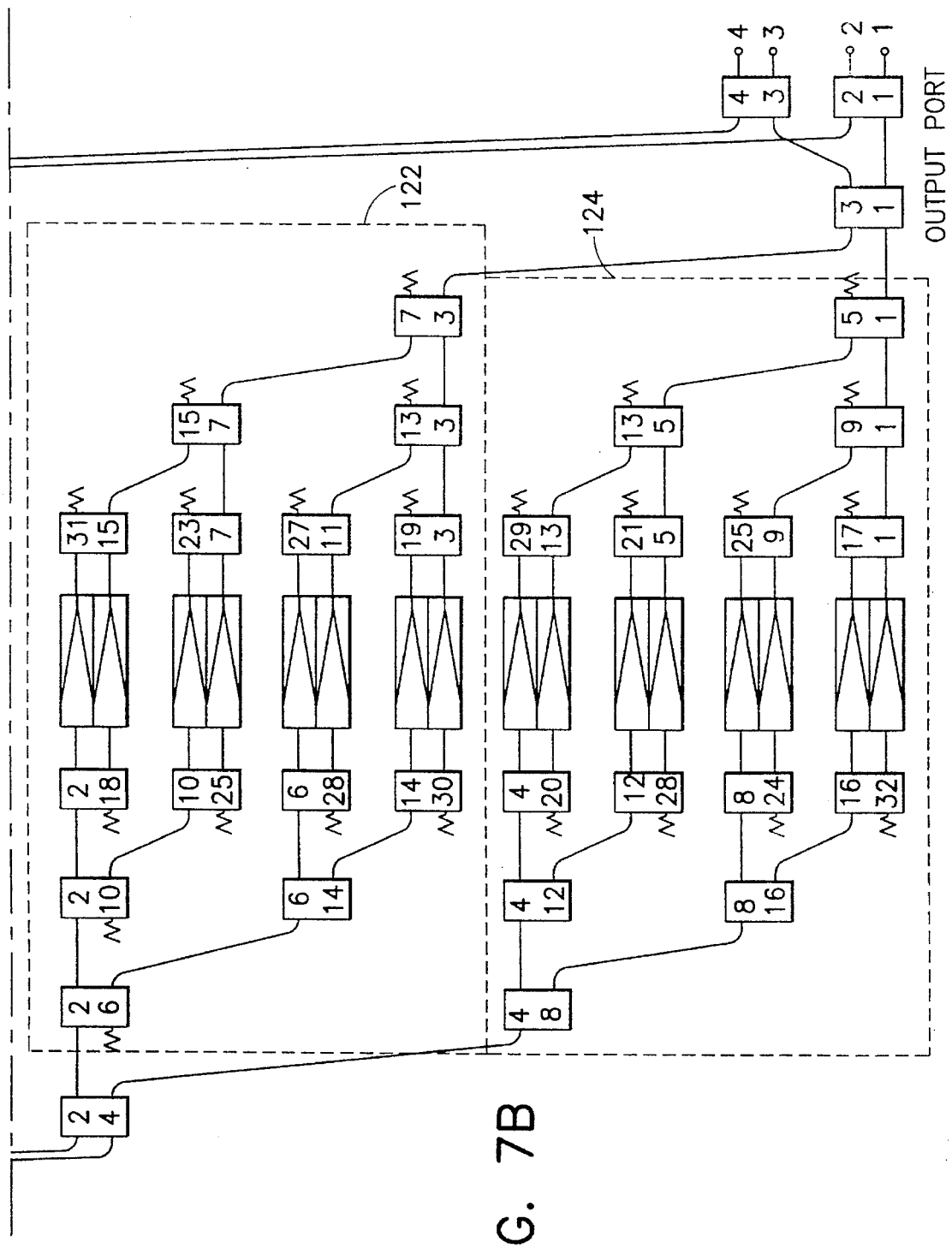

FIGS. 6A and 6B is an illustration of the same embodiment of FIGS. 5A and 5B with the same components but with the signal paths from input ports numbers 1 and 2 to output ports numbers 1 and 2 shown in bold lines. Topologically this signal path follows one of the thirty-two stage hybrid tree paths, and in fact, each of the other signal paths of the thirty-two paths follows its corresponding hybrid tree path embedded in the multi-port amplifier. Therefore, if only four input/output pairs are required it should be possible to achieve this topology with the equivalent of four embedded hybrid trees. Any hybrids that are not part of the four embedded hybrid trees will carry no signal and can be replaced with load resistor terminations as shown in FIGS. 7A and 7B. FIGS. 7A and 7B show the thirty-two path multi-port amplifier embodiment of FIG. 6 with the excess hybrids removed. The multi-port amplifier of FIGS. 7A and 7B contains four, eight stage hybrid trees as shown in the dotted boxes 118, 120, 122 and 124. Note that all the hybrids that are part of these eight stage hybrid trees all have one port terminated by a load resistor. This means that any imbalance within an eight stage hybrid tree can not reduce the isolation of the output ports per se since all products of the imbalance within that tree are dissipated by the terminating resistors connected to the hybrids. Therefore, any stage within the eight stage hybrid tree multi-port amplifier can be turned off without affecting output port isolation if a stage (any one stage) in each of the other three, eight stage hybrid tree amplifiers are turned off.

Redundancy can be achieved therefore by turning off one amplifier device within each eight stage hybrid tree multi-port amplifier as a stand-by redundant replacement. The cost of this method of redundancy is increased power consumption. If one of each eight stages is turned off, the output of the remaining seven stages must be increased by a factor 1.306 which leads to a total power increase of 14.3%. When the first failure occurs the standby amplifier within the group of eight is turned on with no adverse effects on the multi-port amplifier's performance. Successive failures will also have no impact upon the multi-port amplifier's performance as long as the failure occurs within a group of eight stages that has a stand by redundant stage. Assuming there are multiple (two) failures in a group of eight devices it is possible to minimize the effect of the failure. Assuming that the multi-port amplifier is designed to deliver thirty-two watts with one device shut off in each group of eight, assume two stages fail in group one with the other groups intact. With the second failure the output of group one is reduced from eight watts by a factor of 0.735 to 5.88 watts. To compensate for this loss, the standby redundant stage in group two can be powered on raising the output of group two by a factor of 1.31 from eight watts to 10.45 watts. Since the power going into hybrid H is unbalanced, there will be power appearing in both ports A and B. The output at port A will be 0.327 watts. The power at port B is 16 watts which is unchanged from its initial value. The power output at port one remains at 32 watts while the leakage signal at A is divided equally between Ports 3 and 4. This still provides 22.9 db isolation between the beams at port 1 and ports 3 and 4, with the isolation at port 2 unchanged. The strategy of turning off strategic amplifier stages allows redundancy for multiple failures without resorting to RF switches.

I claim:

1. A multi-port amplifier system including a redundancy feature comprising:

a plurality of N input ports where N is an even integer, a plurality of N amplifier devices each including a power supply for providing a power signal for energizing said device;

a first multi-port hybrid coupler tree connected between said N input ports and the inputs of said N amplifier devices, said first multi-port hybrid coupler tree including N/2 groups of multi-port hybrid coupler stages each having N/8 hybrid coupler circuits connected in series between said N input ports and said inputs of said N amplifier devices;

a plurality of N output ports, a second multi-port hybrid coupler tree connected between the outputs of said N amplifier devices and said N output ports, said second multi-port hybrid coupler tree including N/2 groups of multi-port hybrid coupler stages each having N/8 hybrid coupler circuits connected in series between said outputs of said N amplifier devices and said N output ports wherein each input port is connected to a corresponding output port by a separate path through one of said N/8 stages of series connected hybrid circuits of said first tree, a separate one of said N amplifiers devices, and a separate one of said stages of said N/8 hybrid coupler circuits of said second tree wherein said input ports are connected to input signals, and wherein said input signals are connected from said input ports through separate paths of said hybrid coupler circuits of said first tree, separate amplifier devices and said separate paths of hybrid coupler circuits of said second tree to separate output ports, and wherein the said power signal for an amplifier device within each of said multi-port hybrid coupler trees is unconnected and said amplifier device is off to provide a redundant stand-by replacement amplifier device for power failures.

2. A multi-port amplifier system according to claim 1 wherein and all the N input ports are connected to an input signal.

3. A multi-port amplifier system according to claim 1 wherein less than N of said N input ports are connected to an input signal.

4. A multi-port amplifier system according to claim 3 wherein power supply signals to ones of said N amplifier devices are unconnected and therefore said ones of said N amplifier devices are off.

* * * * *